(12) United States Patent
Habel et al.

(10) Patent No.: US 7,616,517 B1
(45) Date of Patent: Nov. 10, 2009

(54) CONFIG LOGIC POWER SAVING METHOD

(75) Inventors: Stephan Habel, Berg (DE); Claus Pribbernow, München (DE); Stefan Block, München (DE); Herbert Preuthen, Dorfen (DE)

(73) Assignee: LSI Corporation, Milpitas, CA (US)

( * ) Notice: Subject to any disclaimer, the term of this patent is extended or adjusted under 35 U.S.C. 154(b) by 6 days.

(21) Appl. No.: 12/167,431

(22) Filed: Jul. 3, 2008

(51) Int. Cl.
*G06F 1/26* (2006.01)
*G11C 5/14* (2006.01)
(52) U.S. Cl. .................. 365/227; 365/228; 365/229; 713/320; 713/323; 713/324
(58) Field of Classification Search ............ 326/38–41; 713/320, 323, 324; 365/226–229
See application file for complete search history.

(56) References Cited

U.S. PATENT DOCUMENTS

| | | | |
|---|---|---|---|
| 6,924,663 B2 * | 8/2005 | Masui et al. | 326/38 |
| 7,319,343 B2 * | 1/2008 | Bhunia et al. | 326/38 |
| 7,562,275 B2 * | 7/2009 | Juhn et al. | 714/726 |

* cited by examiner

*Primary Examiner*—Vibol Tan
(74) *Attorney, Agent, or Firm*—Trexler, Bushnell, Giangiorgi, Blackstone & Marr, Ltd.

(57) ABSTRACT

A circuit which includes an IP cell having a function select input signal line, combinatorial logic having an output connected to the function select input signal line of the IP cell, a configuration register having an output connected to an input of the combinatorial logic, wherein a high/low input signal line is also connected to the combinatorial logic, wherein the circuit provided that the configuration register receives configuration data during a start-up sequence, and configuration data is held by the combinatorial logic as the configuration register powers down during a functional mode.

14 Claims, 1 Drawing Sheet

CONFIG LOGIC POWER SAVING METHOD

BACKGROUND

In semiconductor design, a semiconductor intellectual property core or block (IP core or IP block) is a reusable unit of logic, cell, or chip layout design. The trend in the semiconductor industry, and this includes IP blocks, is that the devices have become smaller and smaller, and more and more complex and dense. Since the full verification of a complex IP block is almost impossible, the trend is to design IP blocks such that they are configurable. This is especially true for IP blocks that include analog components or have only analog components, as the presence of analog components makes verifying the IP block even more difficult.

This leads to the design of "glue logic," where "glue logic" is custom electronic circuitry which is needed to achieve compatible interfaces between two devices. With regard to IP blocks, glue logic enables a user to reconfigure the IP in the final device to avoid respins. In current technology nodes like 90 nm and 65 nm, the area overhead is not too much of a concern with regard to the glue logic, but the power the glue logic consumes is a major issue.

A good example of IP which has heavy configuration requirements is a serializer/deserializer (SerDes) which is a pair of functional blocks commonly used in high speed communications. The blocks convert data between serial data and parallel interfaces in each direction. One reason why configuration requirements are high with regard to a SerDes is the fact that a SerDes is intended to support different protocols. Another reason relates to the adjustment capabilities of the analog portion of a SerDes as well as the I/O's.

One SerDes example with heavy configuration requirements is LSI's 90 nm SerDes targeting PCI-Express/SAS/FC protocol (expansion card interface technology). Such SerDes actually has about 650 configuration input signals. Another SerDes which targets SONET/SDH SerDes (fiber optic interface technology) and proprietary backplane applications has internal registers (controlled by an advanced high-performance bus (AHB)) which number about 700. This is just the register overhead itself, but there is always some control logic necessary to program these registers, like AHB IF or an external processor (e.g., Intel 8051). This control logic can add an additional 700-1000 registers. Taking a factor of 10-15 for a register/gate equivalent, the additional gates which are required number in the range of 20,000. (One configuration module which currently exists is even more extreme and has 57,780 gates (master)). If one assumes that such a SerDes will be used 16 to 32 times on a customer design, the gate count of the configuration registers can easily rise up to 600,000 and above.

With smaller technology, the leakage power consumption become more dominant than the dynamic power, especially since there exists good techniques to address dynamic power reduction (e.g., clock gating). The assumption is that for configuration registers as described above, the clock gating approach should be very effective. However, the leakage portion of the power consumption still exists and dominates the total power consumption.

OBJECTS AND SUMMARY

An object of an embodiment of the present invention is to provide a circuit which provides that configuration registers can be powered down during a functional mode.

Briefly, and in accordance with at least one of the foregoing objects, an embodiment of the present invention provides a circuit which includes an IP cell having a function select input signal line, combinatorial logic having an output connected to the function select input signal line of the IP cell, a configuration register having an output connected to an input of the combinatorial logic, wherein a high/low input signal line is also connected to the combinatorial logic, wherein the circuit provided that the configuration register receives configuration data during a start-up sequence, and configuration data is held by the combinatorial logic as the configuration register powers down during a functional mode.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
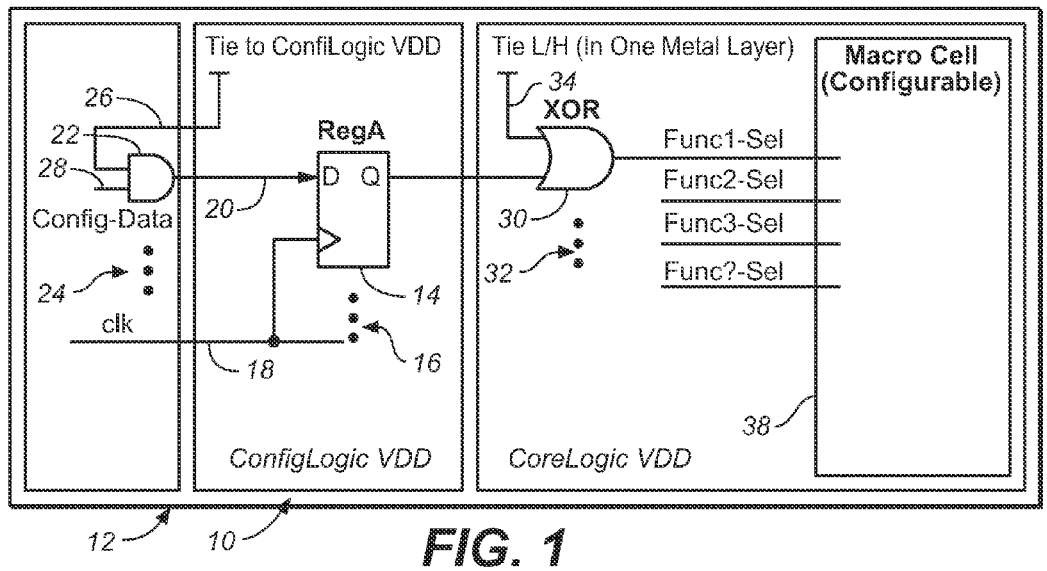
FIG. 1 provides a circuit diagram, where the circuit is in accordance with an embodiment of the present invention.

While the invention may be susceptible to embodiment in different forms, there are shown in the drawings, and herein will be described in detail, specific embodiments of the invention. The specific embodiments which are illustrated and described are to be considered examples of how the present invention can be employed, and is not intended to limit the present invention to that which is illustrated and described herein.

FIG. 1 provides a circuit diagram, where the circuit 10 is included on a multiple-layer chip 12 and is in accordance with an embodiment of the present invention. The circuit 10 includes configuration registers 14 (while only one register is shown in FIG. 1, the dots 16 identify the fact that a plurality of registers 14 (i.e., a register array) are provided). Each register 14 is connected to a clock signal line 18, and receives configuration data 20, such as from an AND gate 22 (while only one AND gate 22 is shown in FIG. 1, the dots 24 identify the fact that a plurality of AND gates 22 are provided) or some other logic. A power domain signal ("ConfigLogic VDD") 26 is supplied to the AND gate 22 along with a configuration data input signal 28, and an output 20 of the AND gate 22 is provided to an input of the configuration register 14. Each configuration register 14 is connected to combinatorial logic, such as an XOR gate 30 (while only one XOR gate 30 is shown in FIG. 1, the dots 32 identify the fact that a plurality of XOR gates 30 are provided). Also connected to each XOR gate 30 is a high/low signal 34 which is preferably selectively provided from one of the metal layers in the stack of the chip 12. As shown in FIG. 1, the output of each of the XOR gates 30 is connected to a function selection input signal line 36 provided to the IP cell 38 (i.e., a configurable macro cell).

When the chip 12 is designed and the prototypes are verified and evaluated in the system, there is a fixed start-up sequence (i.e., configuration data) defined which initializes the configuration registers 14. This sequence is very likely never changed again.

In accordance with the present invention, the configuration registers 14 which are written once at the start-up sequence of the chip 12, are subsequently put into power down mode during the functional mode. Before entering the power down mode, the configuration values are held by the combinatorial logic (i.e., the XOR gates) 30. The power domain "ConfigLogic VDD" 26 of the configuration register array 14 is shut down; hence, the dynamic power and the leakage power of the configuration register array 14 is brought down close to zero.

The register array 14 is effectively used to store the configuration values of the IP cell 38. The combinatorial logic (i.e., the XOR gates) 30 enables the designer to define a default value (via the high/low signals 34), which can be overwritten by the data from the configuration registers 14.

During the evaluation phase, the power domain "ConfigLogic VDD" 26 is put on the same supply (i.e., have a common source) with the power domain "Corelogic VDD" and hence enables full flexibility with regard to configuring the IP cell 38. Assuming the best case scenario, the pre-defined values on the XOR gates 30 are still valid. This allows for the removal of the ConfigLogic VDD power supply and the ability to tie it to ground. The output of each the configuration registers 14 will be a static "0", and the high/low values 34 which are tied to the XOR gates 30 define the configuration signal values. In such case, all the configuration registers 14 (i.e., the entire array) will be removed from power and hence do not leak anymore.

In the case where the predefined values are not correct, the evaluation phase will determine the correct value. With a relatively inexpensive respin of one metal mask, the value which is tied to the XOR gate 30 (i.e., the high/low signal 34) can be changed. Again, this allows for the removal of the ConfigLogic VDD power supply and the ability to tie it to ground. As such, the output of each the configuration registers 14 will be a static "0", and the high/low values 34 which are tied to the XOR gates 30 are used define the configuration signal values. In such case, all the configuration registers 14 (i.e., the entire array) are removed from power and hence do not leak anymore.

While one AND gate 22, one configuration register 14, and one XOR gate 30 is illustrated in FIG. 1, it must be understood that a plurality of each of these components are provided (as identified by the sets of dots 16, 24, 32 shown in FIG. 1). In each case, the power domain "ConfigLogic VDD" and a configuration data signal is provided to the AND gate 22, the output of the AND gate 22 is provided to a configuration register 14 along with a clock signal 18, an output of the configuration register 14 is provided to an XOR gate 30 along with a high/low signal 34 preferably provided from one of the metal layers in the chip stack 12, and the output of the XOR gate 30 is provided to a function select input signal line 36 of the IP cell 38.

Figure 2:
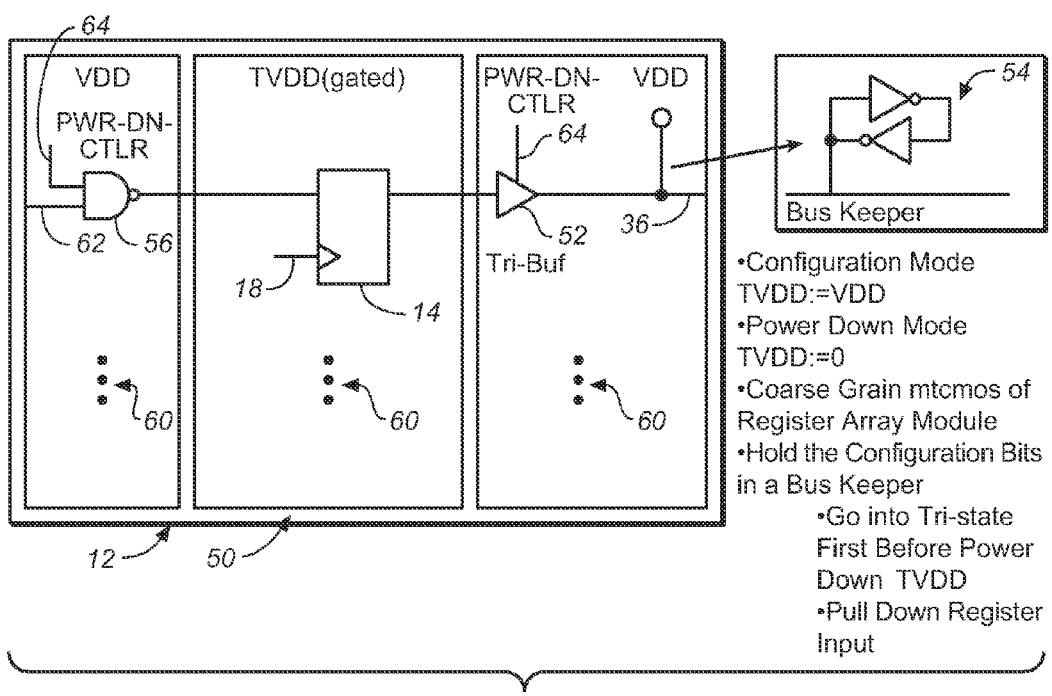
FIG. 2 provides a circuit diagram, where the circuit is in accordance with an alternative embodiment of the present invention.

Another way to achieve the same effect as the circuit shown in FIG. 1 is via the circuit 50 shown in FIG. 2, which illustrates an alternate embodiment. The circuit 50 of FIG. 2 differs from the circuit 10 shown in FIG. 1 in that, in FIG. 2, each of the XOR gates 30 is replaced with a tri-state buffer 52 which is connected to a bus keeper circuit 54. Additionally, each of the AND gates 22 is replaced with a NAND gate 56 (the NAND gate 56 is optional). While one NAND gate 56, one configuration register 14, one tri-state buffer 52, and one bus keeper circuit 54 is illustrated in FIG. 2, it must be understood that a plurality of each of these components is provided (as identified by the sets of dots 60 shown in FIG. 2). In each case, a configuration data signal 62 as well as a power down control signal 64, such as from a microprocessor, is provided to the NAND gate 56, the output of the NAND gate is provided to a configuration register 14 along with a clock signal 18, an output of the configuration register 14 is provided to a tri-state buffer 52 along with a power down control signal 64, such as from a microprocessor, and the tri-state buffer 52 is provided to a bus keeper circuit 54, and an output of the bus keeper circuit is connected to a function select input signal line 36 of the IP cell 38 (such as is shown in FIG. 1).

In the circuit 50 shown in FIG. 2, the configuration value is held its state with the bus keeper circuit 54, and the powered down registers 14 are decoupled by using the tri-state buffers 52. To properly enter the power down mode, the power down control signal 64 which is provided to the NAND gates 56 and the tri-state buffers 52 will be "0". The circuit 50 is configured such that the configuration bits go into the tri-state buffers 52 and are kept in the bus keepers 54 before the configuration registers 14 are powered down, and these configuration bits are pulled from the bus keepers 54 in the event of powering down the configuration registers 14.

The advantage of the solution shown in FIG. 2 is flexibility—the power down mode can be controlled via a register write of a microprocessor for instance, while the first option (FIG. 1) would require a change on the board (i.e., to tie the power domain "ConfigLogic VDD" to ground).

With regard to FIG. 1, for each configuration bit which needs to be accessed during application, the additional cost includes the XOR gate and the tie cell. In FIG. 2, the additional cost includes the tri-state buffer, the bus keep circuit and the NAND gate (optional). For configuration bits which are not accessed by the application, no additional logic is required.

While embodiments of the present invention are shown and described, it is envisioned that those skilled in the art may devise various modifications to the embodiment without departing from the spirit and scope of the present invention.

What is claimed is:

1. A circuit on a chip and comprising: an IP cell having a function select input signal line; combinatorial logic having an output connected to the function select input signal line of the IP cell; a configuration register having an output connected to an input of the combinatorial logic, wherein a high/low input signal line is also connected to the combinatorial logic, wherein the circuit is configured such that the configuration register receives configuration data during a start-up sequence, and the circuit is configured such that the configuration data is held by the combinatorial logic as the configuration register powers down during a functional mode.

2. The circuit as recited in claim 1, wherein the combinatorial logic comprises an XOR gate.

3. The circuit as recited in claim 1, wherein the combinatorial logic comprises a tri-state buffer connected to a bus keeper, wherein an output of the configuration register is connected to an input of the tri-state buffer, and an output of the bus keeper is connected to the function select input signal line of the IP cell.

4. The circuit as recited in claim 3, further comprising a NAND gate which has its output connected to an input of the configuration register.

5. The circuit as recited in claim 1, further comprising an AND gate which has its output connected to an input of the configuration register.

6. The circuit as recited in claim 1, further comprising an AND gate which has its output connected to an input of the configuration register, wherein configuration data is provided to the AND gate during a start up sequence, along with a power domain signal.

7. The circuit as recited in claim 6, wherein the circuit is configured such that the power domain signal is not provided to the AND gate during the functional mode.

8. The circuit as recited in claim 1, wherein the circuit is configured such that data received by the combinatorial logic from the configuration register is useable to overwrite the high/low input signal provided to the combinatorial logic.

9. A circuit on a chip and comprising: an IP cell having a plurality of function select input signal lines; combinatorial logic having outputs connected to the function select input signal lines of the IP cell; configuration registers having outputs connected to inputs of the combinatorial logic, wherein a high/low input signal line is also connected to the combinatorial logic, wherein the circuit is configured such that the configuration registers receive configuration data during a start-up sequence, and the circuit is configured such that the configuration data is held by the combinatorial logic as the configuration registers power down during a functional mode.

10. The circuit as recited in claim 9, wherein the combinatorial logic comprises a plurality of XOR gates.

11. The circuit as recited in claim 9, further comprising a plurality of AND gates which has their outputs connected to inputs of the configuration registers.

12. The circuit as recited in claim 9, further comprising a plurality of AND gates which have their outputs connected to inputs of the configuration registers, wherein configuration data is provided to the AND gates during a start up sequence, along with a power domain signal.

13. The circuit as recited in claim 12, wherein the circuit is configured such that the power domain signal is not provided to the AND gates during the functional mode.

14. The circuit as recited in claim 9, wherein the circuit is configured such that data received by the combinatorial logic from the configuration registers is useable to overwrite the high/low input signals provided to the combinatorial logic.

* * * * *